United States Patent
Ramamurthy et al.

(10) Patent No.: US 8,536,492 B2
(45) Date of Patent: Sep. 17, 2013

(54) PROCESSING MULTILAYER SEMICONDUCTORS WITH MULTIPLE HEAT SOURCES

(75) Inventors: Sundar Ramamurthy, Fremont, CA (US); Andreas G. Hegedus, Burlingame, CA (US); Randhir Thakur, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1910 days.

(21) Appl. No.: 11/187,188

(22) Filed: Jul. 22, 2005

(65) Prior Publication Data

US 2006/0018639 A1    Jan. 26, 2006

Related U.S. Application Data

(63) Continuation-in-part of application No. 10/950,145, filed on Sep. 24, 2004, now Pat. No. 7,127,367.

(60) Provisional application No. 60/515,037, filed on Oct. 27, 2003.

(51) Int. Cl.
F27B 5/14        (2006.01)
(52) U.S. Cl.
USPC ........................................... 219/390
(58) Field of Classification Search
USPC ................. 219/200, 385, 390, 553; 392/405, 392/416
See application file for complete search history.

(56) References Cited

U.S. PATENT DOCUMENTS

| | | | | |
|---|---|---|---|---|
| 4,558,660 A | * | 12/1985 | Nishizawa et al. | 118/725 |
| 4,653,428 A | * | 3/1987 | Wilson et al. | 118/725 |
| 4,820,377 A | * | 4/1989 | Davis et al. | 134/1.1 |
| 4,830,700 A | * | 5/1989 | Davis et al. | 156/345.37 |
| 4,832,777 A | * | 5/1989 | Davis et al. | 156/345.37 |
| 4,832,778 A | * | 5/1989 | Davis et al. | 156/345.31 |
| 4,832,779 A | * | 5/1989 | Fisher et al. | 156/345.37 |

(Continued)

FOREIGN PATENT DOCUMENTS

| | | |
|---|---|---|
| CN | 1 202725 | 12/1998 |
| EP | 1 197 989 A2 | 4/2002 |

(Continued)

OTHER PUBLICATIONS

Chinese Office Action dated Jul. 27, 2007 for Chinese Application No. 200480031540.0.

(Continued)

*Primary Examiner* — Henry Yuen
*Assistant Examiner* — Eric Stapleton
(74) *Attorney, Agent, or Firm* — Patterson & Sheridan, LLP

(57) ABSTRACT

A method and apparatus for rapid thermal annealing comprising a plurality of lamps affixed to a lid of the chamber that provide at least one wavelength of light, a laser source extending into the chamber, a substrate support positioned within a base of the chamber, an edge ring affixed to the substrate support, and a gas distribution assembly in communication with the lid and the base of the chamber. A method and apparatus for rapid thermal annealing comprising a plurality of lamps comprising regional control of the lamps and a cooling gas distribution system affixed to a lid of the chamber, a heated substrate support with magnetic levitation extending through a base of the chamber, an edge ring affixed to the substrate support, and a gas distribution assembly in communication with the lid and the base of the chamber.

3 Claims, 6 Drawing Sheets

(56) References Cited

U.S. PATENT DOCUMENTS

| | | | | |
|---|---|---|---|---|
| 4,911,103 | A * | 3/1990 | Davis et al. | 118/725 |
| 4,914,276 | A * | 4/1990 | Blair | 219/390 |
| 5,155,336 | A | 10/1992 | Gronet et al. | |
| 5,317,492 | A | 5/1994 | Gronet et al. | |
| 5,399,523 | A | 3/1995 | Kakoschke | |
| 5,487,127 | A | 1/1996 | Gronet et al. | |
| 5,508,532 | A | 4/1996 | Teramoto | |
| 5,530,265 | A | 6/1996 | Takemura | |
| 5,576,059 | A | 11/1996 | Beinglass et al. | |
| 5,648,277 | A | 7/1997 | Zhang et al. | |
| 5,660,472 | A | 8/1997 | Peuse et al. | |
| 5,683,173 | A | 11/1997 | Gronet et al. | |
| 5,689,614 | A | 11/1997 | Gronet et al. | |
| 5,708,755 | A | 1/1998 | Gronet et al. | |
| 5,712,495 | A | 1/1998 | Suzawa | |
| 5,719,065 | A | 2/1998 | Takemura | |
| 5,755,511 | A | 5/1998 | Peuse et al. | |
| 5,767,486 | A | 6/1998 | Gronet et al. | |
| 5,790,751 | A | 8/1998 | Gronet et al. | |
| 5,840,125 | A | 11/1998 | Gronet et al. | |
| 5,892,236 | A | 4/1999 | Takahashi et al. | |
| 5,937,142 | A | 8/1999 | Moslehi et al. | |
| 5,945,711 | A | 8/1999 | Takemura et al. | |
| 5,998,766 | A * | 12/1999 | Mizosaki et al. | 219/390 |
| 6,001,756 | A | 12/1999 | Takahashi et al. | |
| 6,013,236 | A | 1/2000 | Takahashi et al. | |
| 6,016,383 | A | 1/2000 | Gronet et al. | |
| 6,037,273 | A | 3/2000 | Gronet et al. | |
| 6,087,245 | A | 7/2000 | Yamazaki et al. | |
| 6,090,733 | A | 7/2000 | Otsuki et al. | |
| 6,122,439 | A | 9/2000 | Gronet et al. | |
| 6,136,163 | A | 10/2000 | Cheung et al. | |
| 6,156,628 | A | 12/2000 | Ohnuma et al. | |
| 6,159,866 | A | 12/2000 | Gronet et al. | |
| 6,187,704 | B1 | 2/2001 | Takahashi et al. | |
| 6,210,484 | B1 * | 4/2001 | Hathaway | 118/724 |
| 6,214,755 | B1 | 4/2001 | Otsuki et al. | |
| 6,215,106 | B1 | 4/2001 | Boas et al. | |
| 6,217,969 | B1 | 4/2001 | Takahashi et al. | |
| 6,259,066 | B1 * | 7/2001 | Touchais-Papet et al. | 219/411 |
| 6,261,370 | B1 | 7/2001 | Otsuki et al. | |
| 6,303,411 | B1 | 10/2001 | Camm et al. | |
| 6,375,348 | B1 | 4/2002 | Hebb et al. | |
| 6,375,752 | B1 | 4/2002 | Otsuki et al. | |
| 6,376,804 | B1 | 4/2002 | Ranish et al. | |
| 6,387,761 | B1 | 5/2002 | Shih et al. | |
| 6,388,297 | B1 | 5/2002 | Talwar et al. | |
| 6,393,210 | B1 | 5/2002 | Wu | |
| 6,402,850 | B1 | 6/2002 | Beinglass et al. | |
| 6,406,179 | B2 | 6/2002 | Adams et al. | |
| 6,410,456 | B1 | 6/2002 | Gronet et al. | |
| 6,429,104 | B1 | 8/2002 | Auberton-Herve | |
| 6,434,327 | B1 | 8/2002 | Gronett et al. | |
| 6,468,879 | B1 | 10/2002 | Lamure et al. | |
| 6,476,362 | B1 | 11/2002 | Deacon et al. | |
| 6,500,266 | B1 | 12/2002 | Ho et al. | |
| 6,534,752 | B2 | 3/2003 | Camm et al. | |
| 6,559,015 | B1 | 5/2003 | Yu | |
| 6,569,716 | B1 | 5/2003 | Suzuki | |
| 6,570,134 | B2 * | 5/2003 | Suzuki et al. | 219/390 |
| 6,570,137 | B1 | 5/2003 | Jennings | |
| 6,576,065 | B1 | 6/2003 | Lamure | |
| 6,599,818 | B2 | 7/2003 | Dairiki | |
| 6,709,960 | B1 | 3/2004 | Xiang | |
| 6,743,643 | B2 | 6/2004 | Joshi et al. | |
| 6,768,084 | B2 * | 7/2004 | Liu et al. | 219/390 |
| 6,800,833 | B2 * | 10/2004 | Gregor et al. | 219/390 |
| 6,803,297 | B2 | 10/2004 | Jennings et al. | |
| 6,833,536 | B2 * | 12/2004 | Shigeura | 219/553 |
| 6,839,507 | B2 * | 1/2005 | Adams et al. | 392/416 |
| 6,853,802 | B2 | 2/2005 | Neyret et al. | |
| 6,897,131 | B2 | 5/2005 | Ramachandran et al. | |
| 6,916,398 | B2 | 7/2005 | Chen | |
| 6,916,744 | B2 | 7/2005 | Achutharaman | |
| 7,038,173 | B2 * | 5/2006 | Takahashi et al. | 219/390 |
| 2001/0017294 | A1 | 8/2001 | Aoki et al. | |
| 2002/0096436 | A1 | 7/2002 | Olgado et al. | |
| 2002/0192914 | A1 | 12/2002 | Kizilyalli et al. | |
| 2003/0000647 | A1 | 1/2003 | Yudovsky et al. | |
| 2003/0010640 | A1 | 1/2003 | Kholodenko | |
| 2003/0015141 | A1 | 1/2003 | Takagi | |
| 2003/0040130 | A1 | 2/2003 | Mayur et al. | |
| 2003/0044621 | A1 | 3/2003 | Won et al. | |
| 2003/0066826 | A1 | 4/2003 | Lee et al. | |
| 2003/0104664 | A1 | 6/2003 | Kondo et al. | |
| 2003/0121608 | A1 | 7/2003 | Chen | |
| 2003/0146200 | A1 * | 8/2003 | Takahashi et al. | 219/390 |
| 2003/0183611 | A1 | 10/2003 | Gregor et al. | |
| 2003/0186563 | A1 | 10/2003 | Kobayashi et al. | |
| 2003/0194877 | A1 | 10/2003 | Yau et al. | |
| 2004/0106246 | A1 | 6/2004 | Ogata et al. | |
| 2004/0120050 | A1 | 6/2004 | Tsukihara et al. | |
| 2004/0126999 | A1 | 7/2004 | Ramachandran et al. | |
| 2004/0144311 | A1 | 7/2004 | Chen | |
| 2004/0161903 | A1 | 8/2004 | Yuan et al. | |
| 2004/0209414 | A1 | 10/2004 | Mok et al. | |
| 2005/0102108 | A1 | 5/2005 | Ramachandran et al. | |
| 2005/0109276 | A1 | 5/2005 | Iyer et al. | |
| 2005/0186765 | A1 | 8/2005 | Ma et al. | |

FOREIGN PATENT DOCUMENTS

| | | |
|---|---|---|
| JP | 05-114570 A | 5/1993 |
| JP | 2002-231649 | 8/2002 |
| KR | 2002-0028824 | 4/2002 |
| WO | WO 02/061808 A2 | 8/2002 |

OTHER PUBLICATIONS

First Office Action dated Aug. 21, 2009 for Chinese Patent Application No. 2008100980377.
Korean Notice to File a Response dated Mar. 18, 2010 for Korean Patent Application No. 10-2008-0046588.
Notice to File a Response dated Apr. 15, 2011 for Korean Patent Application No. 10-2006-7010231.
PCT International Search Report for International Application No. PCT/US2004/034811, Oct. 20, 2004.
PCT Invitation to Pay Additional Fees dated Feb. 2, 2005 for International Application No. PCT/US2004/034811.
Ritala and Leskela, Chapter 2, Atomic Layer Deposition Department of Chemistry, University of Helsinki, In-00014, Finland (pp. 103-159), 2002.
U.S. Appl. No. 10/124,908, filed May 9, 2005.
U.S. Appl. No. 10/851,514, filed May 21, 2004.
U.S. Appl. No. 11/127,767, filed May 12, 2005.

* cited by examiner

PROCESSING MULTILAYER SEMICONDUCTORS WITH MULTIPLE HEAT SOURCES

CROSS-REFERENCE TO RELATED APPLICATIONS

This application is a continuation-in-part of U.S. patent application Ser. No. 10/950,145, filed Sep. 24, 2004 and issued as U.S. Pat. No. 7,127,367, which claims benefit of U.S. provisional patent application Ser. No. 60/515,037, filed Oct. 27, 2003. Each of the aforementioned related patent applications is herein incorporated by reference.

This application is related to U.S. patent application Ser. No. 11/751,027, filed May 20, 2007.

BACKGROUND OF THE INVENTION

1. Field of the Invention

The present invention relates generally to the field of semiconductor processing and, more specifically, to thermal annealing during semiconductor device fabrication.

2. Description of the Related Art

Rapid thermal processing (RTP) is a process for annealing substrates during semiconductor fabrication. During this process, thermal radiation is used to rapidly heat a substrate in a controlled environment to a maximum temperature of over nine hundred degrees above room temperature. This maximum temperature is maintained for less than one second to several minutes, depending on the process. The substrate is then cooled to room temperature for further processing. High intensity tungsten or halogen lamps are used as the source of thermal radiation. Conductively coupling the substrate to a heated susceptor provides additional heat.

The semiconductor fabrication process has several applications of RTP. Such applications include thermal oxidation (a substrate is heated in oxygen or a combination of oxygen and hydrogen which causes the silicon substrate to oxidize to form silicon dioxide); high temperature soak anneal (different gas mixtures such as nitrogen, ammonia, or oxygen are used); low temperature soak anneal (typically to anneal wafers deposited with metals); and spike anneal (primarily used in processes where the substrate needs to be exposed to high temperatures for a very short time). During a spike anneal, the substrate is rapidly heated to a maximum temperature sufficient to activate a dopant and cooled rapidly to end the activation process prior to substantial diffusion of the dopant.

A method and apparatus for spike anneal is described in U.S. patent application No. 2003/0183611, published Oct. 2, 2003, which is hereby incorporated by reference herein. During a spike anneal, the substrate is heated using thermal radiation from an array of lamps. Typically, the substrate is heated at a ramp rate of up to 250° C./sec to temperatures greater than 1000° C. The substrate is then cooled by conductively coupling the hot substrate to the cold reflector plate using a blanket of inert gas such as helium gas. This forced cooling facilitates a faster cooling rate, achieving ramp down rates of up to 80° C./sec.

Activating the polysilicon gate electrode without causing dopant diffusion is a major challenge for front end of line (FEOL) processing. A delicate balance exists between enhanced dopant activation and aggregated dopant diffusion. An aggressive activation anneal may lead to high carrier concentration, but the dopant may be driven into the gate dielectric layer or even into the channel region. The balance becomes more difficult to maintain as device makers try to overcome poly-depletion. Poly-depletion is a reduction of activated dopants within the inversion region of a polysilicon layer. Poly-depletion accounts for an increasing fraction of Tox-inv (carrier concentration/poly-depletion) as gate lengths and gate dielectric thicknesses become smaller. For substrate features in the size of 130 nm and 90 nm, conventional thermal processes such as rapid thermal processing (RTP) and spike annealing are the main dopant activation methods. The resulting poly-depletion contributes 4-5 Å to Tox-inv. An additional reduction of 1 Å of the poly-depletion is necessary for a substrate feature with the size of 65 nm. Drive current gain of about 3% is expected with each angstrom of poly-depletion reduction. Conventional thermal processes are not capable of annealing such small substrate features without provoking dopant diffusion. In addition, preventing dopant penetration and use of thermally sensitive high-k materials requires low thermal budget activation anneal.

Laser anneal, which can achieve high dopant activation without driving dopant diffusion, has been developed to meet the requirements for poly-depletion for use in 65 nm features. Laser annealing technology produces transient temperatures such as about 1350° C. near the silicon melting point within a few milliseconds, which results in high dopant activation with little dopant diffusion. This is a particular benefit for a process such as boron activation, since boron diffuses much faster than does phosphorous and arsenic. However, laser anneal temperatures that melt the silicon have been shown to cause polycrystalline grain size growth which may result in device yield loss.

The object of annealing is often a substantially uniform temperature profile across the substrate. This is achieved by controlling a laser, an array of lamps, or other heat sources which uniformly heat the substrate on the front side while a reflective surface on the back side of the substrate uniformly reflects heat back to the substrate. Emissivity measurement and compensation methodology have been used to improve the uniform temperature gradient across the substrate.

However, uniform control of an anneal chamber that also incorporates the use of a laser often does not provide substantially uniform temperature profiles across the diameter of the substrate. Thus, apparatus and methods to improve uniformity remain of interest and there is a need to have a process for doping polycrystalline layers within a feature and annealing and activating the doped polycrystalline with minimal or no dopant diffusion.

SUMMARY OF THE INVENTION

The present invention generally provides a chamber for rapid thermal annealing comprising a plurality of lamps affixed to a lid of the chamber that provide at least one wavelength of light, a laser source extending into the chamber, a substrate support extending through a base of the chamber, an edge ring affixed to the substrate support, and a gas distribution assembly in communication with the lid and the base of the chamber. The present invention generally provides a chamber for rapid thermal annealing comprising a plurality of lamps comprising regional control of the lamps and a cooling gas distribution system affixed to a lid of the chamber, a heated substrate support with magnetic levitation extending through a base of the chamber, an edge ring affixed to the substrate support, and a gas distribution assembly in communication with the lid and the base of the chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

A combination of approaches is used to create an RTP chamber with a controllable temperature profile that compensates for heat transfer non-uniformity in the chamber. Furthermore, a non-uniform temperature gradient can provide downstream or upstream processing correction for electrical, thickness, chemical, or crystalline imperfections in substrates. For example, a non-uniform temperature gradient can be tailored to compensate for front-side emissivity variation for individual wafers and provide improved silicon containing film deposition.

A substrate can be measured for certain characteristics such as emissivity or stack thickness prior to processing in the RTP chamber. The emissivity of the system can be either directly measured or estimated based on the stack thickness. The direct measurement of the emissivity may Increase the accuracy of the compensation system. There are several options for measuring the emissivity. An internal pyrometer may be used and located within the chamber to obtain an accurate temperature of the chamber environment The internal pyrometer may use two different feedback channels. One of the two channels would collect incident heat directly from the wafer, and the other would collect incident heat from the chamber environment or from a combination of the chamber environment and the wafer. An external reflectometer could be used to measure the reflectivity and hence the emissivity of the wafer. The chamber's internal backside emissivity can be utilized to estimate the front side emissivity of the wafer. To estimate the front side emissivity, a sacrificial wafer may be processed upside down. The wafers that were manufactured at nearly the same time as the sacrificial wafer may be processed as though they have the same emissivity. That is, it may be assumed that the wafers that are manufactured in the same group, lot, or batch may have the same emissivity.

The results of the emissivity testing methods may be fed into a controller for some of the process parameters of the RTP chamber, and the chamber can be adjusted to obtain a desired non-uniform temperature profile that will compensate for variations in chamber or wafer design and optimize the wafer temperature distribution for a particular wafer.

Figure 1:
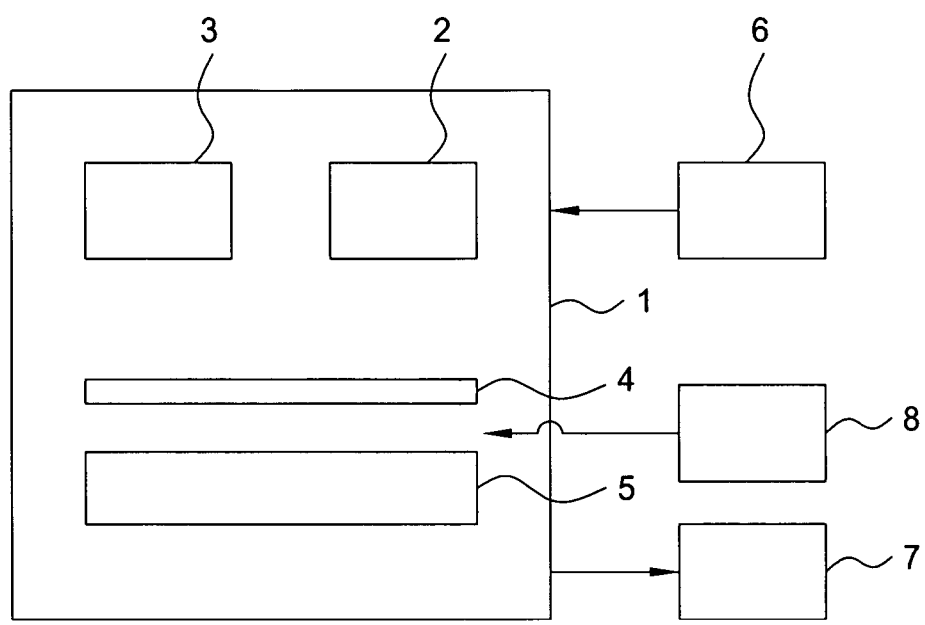
FIG. 1 is a schematic view of a chamber with multiple heat sources.

FIG. 1 provides a schematic view of an RTP chamber 1 with multiple heat sources. Heat source 2 and heat source 3 provide heat to the chamber 1 from two different types of heat sources. Heat source 2 and heat source 3 are selected from arrays of UV heat lamps, laser anneal systems, resistively heated inserts, reflectors, or other heat transfer medium. Substrate support 5 supports a substrate 4 and may be a pedestal or edge ring support. The substrate support 5 may include a reflector with specially tailored heat transfer properties. Process gas enters the chamber 1 through the gas delivery system 6. Gases exit the system through the exhaust system 7. Purge or cooling gases enter the chamber 1 through the cooling gas delivery system 8.

RTP Chambers

Figure 2:
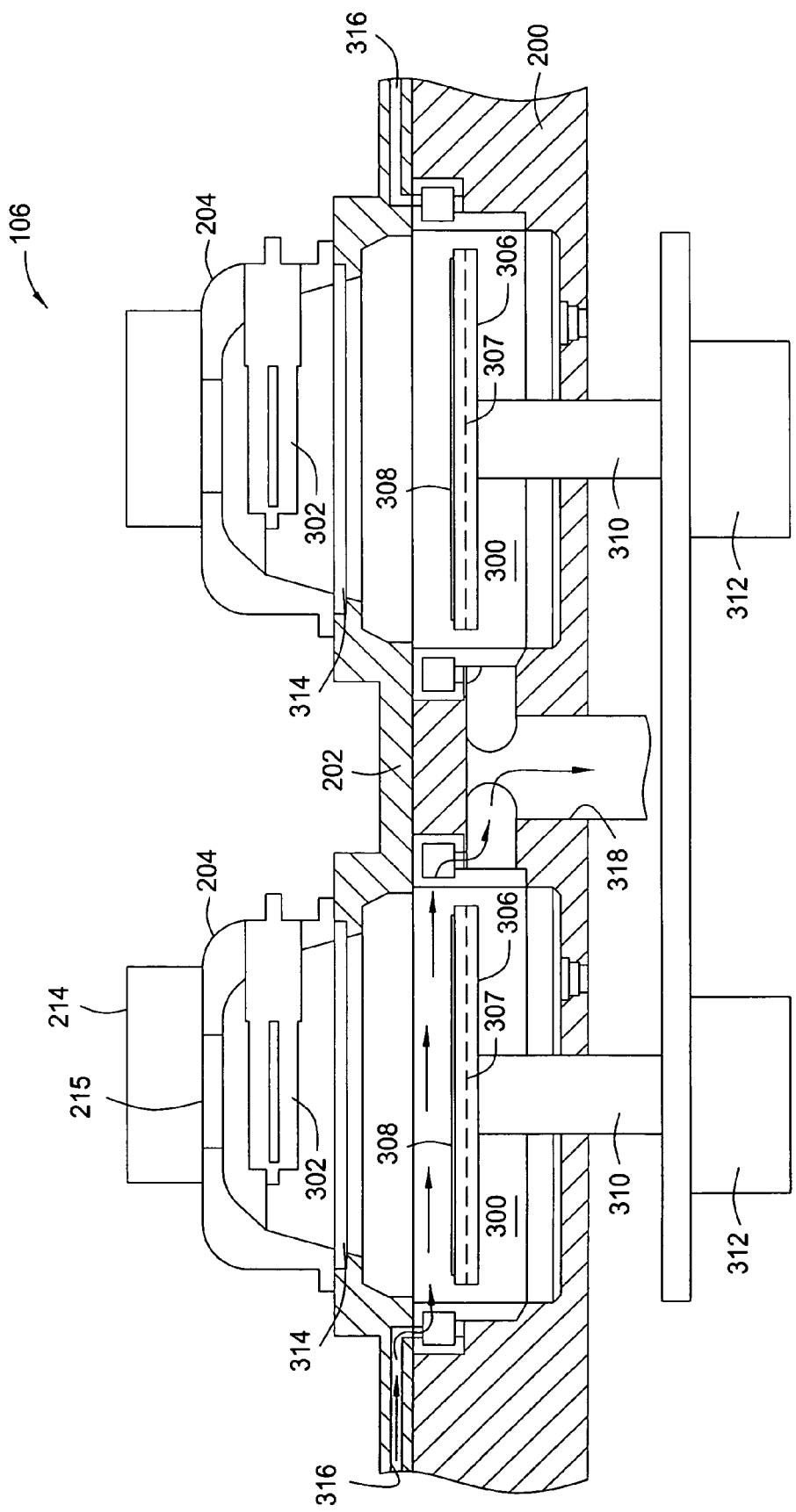
FIG. 2 is a partial section view of the tandem process chamber that has a lid assembly with two UV bulbs disposed respectively above two process regions.

FIG. 2 shows a partial section view of the tandem process chamber 106 with the lid 202, the housings 204, and the power sources 214. Each of the housings 204 cover a respective one of two UV lamp bulbs 302 disposed respectively above two process regions 300 defined within the body 200. Each of the process regions 300 includes a pedestal 306 having a resistive heating element 307 for supporting and heating a substrate 308 within the process regions 300. The pedestals 306 can be made from ceramic or metal such as aluminum. Preferably, the pedestals 306 couple to stems 310 that extend through a bottom of the body 200 and are operated by drive systems 312 to move the pedestals 306 in the processing regions 300 toward and away from the UV lamp bulbs 302. The drive systems 312 can also rotate and/or translate the pedestals 306 during curing to further enhance uniformity of substrate Illumination. Adjustable positioning of the pedestals 306 enables control of volatile cure by-product and purge and clean gas flow patterns and residence times in addition to potential fine tuning of incident UV irradiance levels on the substrate 308 depending on the nature of the light delivery system design considerations such as focal length.

In general, embodiments of the invention contemplate any UV source such as mercury microwave arc lamps, pulsed xenon flash lamps or high-efficiency UV light emitting diode arrays. The UV lamp bulbs 302 are sealed plasma bulbs filled with one or more gases such as argon (Ar), xenon (Xe), or mercury (Hg) for excitation by the power sources 214. Preferably, the power sources 214 are microwave generators that can include one or more magnetrons (not shown) and one or more transformers (not shown) to energize filaments of the magnetrons. In one embodiment having kilowatt microwave (MW) power sources, each of the housings 204 includes an aperture 215 adjacent the power sources 214 to receive up to about 6000 W of microwave power from the power sources 214 to subsequently generate up to about 100 W of UV light from each of the bulbs 302. In another embodiment, the UV lamp bulbs 302 can include an electrode or filament therein such that the power sources 214 represent circuitry and/or current supplies, such as direct current (DC) or pulsed DC, to the electrode.

UV light emitted from the UV lamp bulbs 302 enters the processing regions 300 by passing through windows 314 disposed in apertures in the lid 202. The windows 314 preferably are made of an OH free synthetic quartz glass and have sufficient thickness to maintain vacuum without cracking. Further, the windows 314 are preferably fused silica that transmits UV light down to approximately 150 nm. Since the lid 202 seals to the body 200 and the windows 314 are sealed to the lid 202, the processing regions 300 provide volumes capable of maintaining pressures from approximately 1 Torr to approximately 650 Torr. Processing or cleaning gases enter the process regions 300 via a respective one of two inlet passages 316. The processing or cleaning gases then exit the process regions 300 via a common outlet port 318. Additionally, the cooling air supplied to the interior of the housings 204 circulates past the bulbs 302, but is isolated from the process regions 300 by the windows 314.

Figure 3:
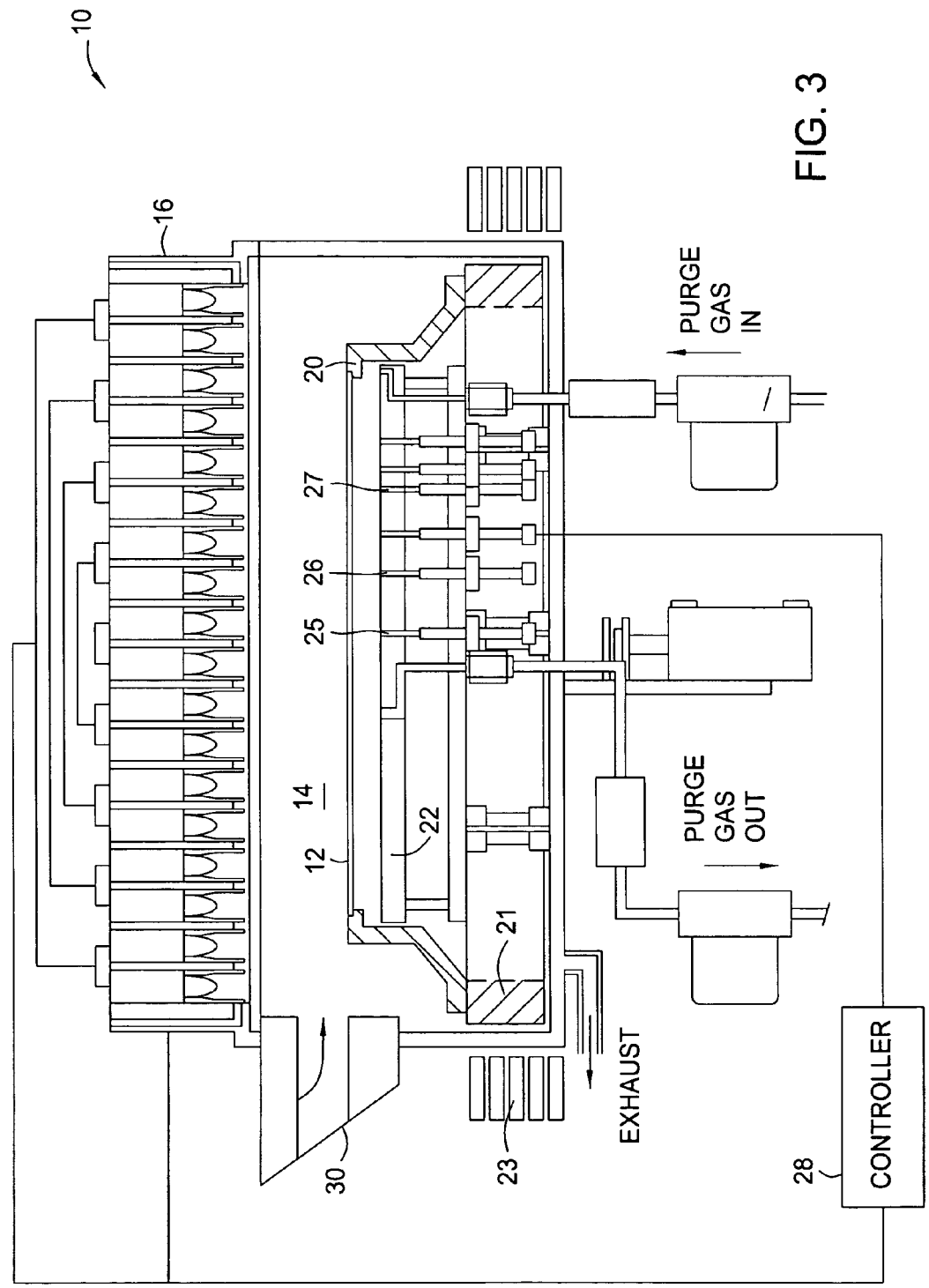
FIG. 3 is a vertical sectional view of a portion of an RTP system according to one embodiment of the present invention.

FIG. 3 illustrates how a substrate 12 is supported in a modified RTP chamber 10 having an array of UV lamps 16. The substrate 12 preferably rests on an edge ring 20 described in more detail below. A controller 28 receives measurements from pyrometers 25, 26, and 27 to output control signals to UV lamps 16.

A reflective surface 22 below the substrate 12 has openings for purge gas lines and sensors (not shown). Location of the openings and flow of purge gas may be configured to facilitate control of the temperature profile of the substrate.

Additional control of wafer non-uniformity is provided if the reflective surface 22 does not rotate as shown, although the reflective surface 22 can be designed to rotate. A stationary reflective surface 22 facilitates localized gas jet cooling and lamp adjustments.

Alternatively, the substrate 12 may be magnetically rotated by an actuator 23 that rotates a stator 21. The actuator 23 is magnetically coupled to the stator 21 and adapted to change the elevation of the stator 21 and/or to adjust the angular orientation of the stator 21 relative to its central axis. A first elevation of the stator 21 places the substrate 12 in a transfer position 14 for removal of the substrate through a slit valve 30. A new substrate is then positioned by the stator 21 for spike annealing.

Reflective surface 22 may be modified to improve a chamber's temperature tailoring capabilities by utilizing openings for pyrometers 25, 26, and 27 and a gas distribution inlet and outlet. Ejecting gas through holes (not shown) in the reflective surface 22 helps speed cooling, because a hole does not reflect energy back to the wafer. Tailoring the design of the holes in the reflector plate can provide another mechanism to facilitate heat transfer.

A rapid thermal anneal system such as the embodiment illustrated by FIGS. 2 and 3 may also include a laser for annealing such as the laser annealing system described in U.S. patent application Ser. No. 10/784,904, filed Feb. 23, 2004 which is hereby incorporated by reference herein.

Lamp Assembly

Figure 4:
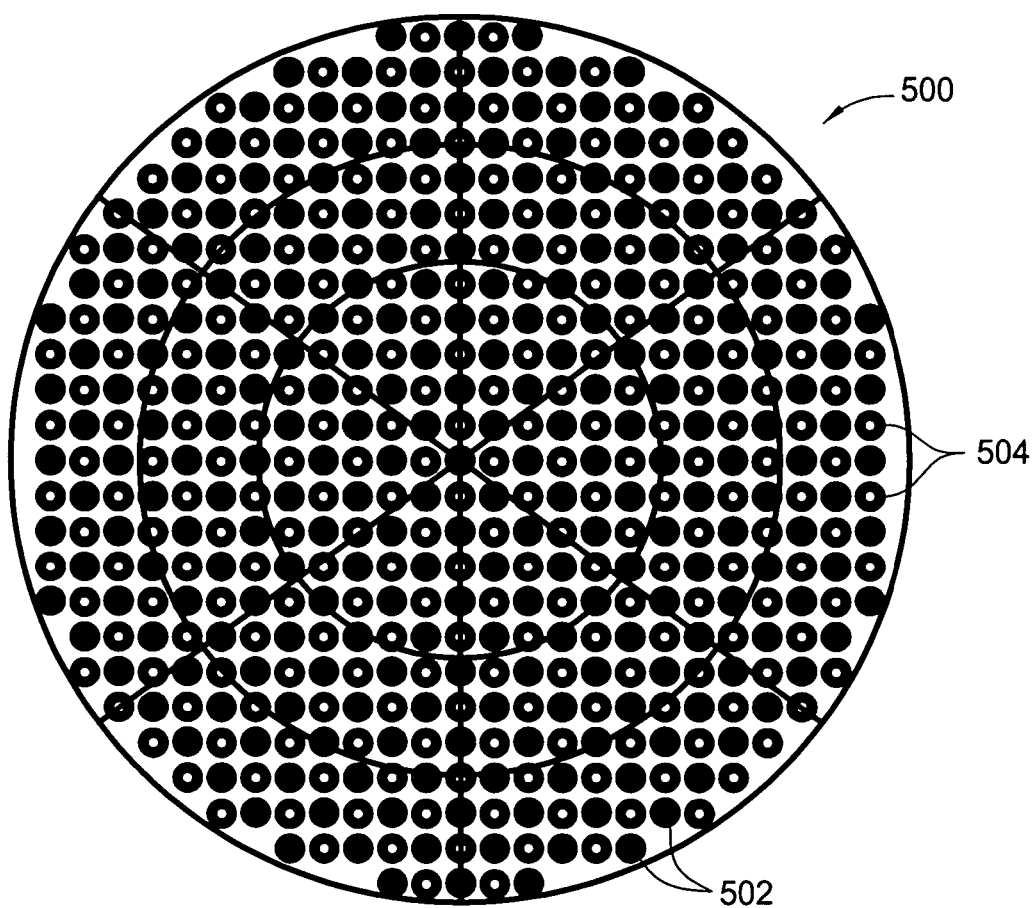
FIG. 4 is a partial view of a bottom surface of a lid assembly that utilizes an array of UV lamps.

FIG. 4 shows a partial view of a bottom surface 500 of a lid assembly that utilizes an array of UV lamps 502. The array of UV lamps 502 can be disposed within a housing above a tandem process chamber instead of single bulbs as depicted in the embodiments shown in FIG. 2. While many individual bulbs are depicted, the array of UV lamps 502 can include as few as two bulbs powered by a single power source or separate power sources. For example, the array of UV lamps 502 in one embodiment includes a first bulb for emitting a first wavelength distribution and a second bulb for emitting a second wavelength distribution. The curing process can thus be controlled by defining various sequences of illumination with the various lamps within a given curing chamber in addition to adjustments in gas flows, composition, pressure, and substrate temperature. In addition, on a multi-curing chamber system, the curing process can be further refined by defining sequences of treatments in each of the tandem curing chambers each of which is controlled independently with respect to parameters such as lamp spectrum, substrate temperature, ambient gas composition, and pressure for the specific portion of the cure for which each is used.

The lamps may be arranged in zones or regions across the array of UV lamps. The zones may extend radially out from the center of the substrate or may be arranged in sections across the diameter of the substrate. For example, the zones may be selected to target more heat to the circumference of the substrate or to provide bulbs with different spectrum for the substrate to be exposed to as the substrate rotates. The bulb placement may influence the resulting substrate properties more markedly when the substrate is not rotated.

The array of UV lamps 502 can be designed to meet specific UV spectral distribution requirements to perform the cure process and the clean process by selecting and arranging one, two, or more different types of individual bulbs within the array of UV lamps 502. For example, bulbs may be selected from low pressure Hg, medium pressure Hg, and high pressure Hg. UV light from bulbs with a wavelength distribution particularly suited for cleaning can be directed to the entire process region while UV light from bulbs with a wavelength distribution particularly suited for curing can be directed specifically to the substrate. Additionally, bulbs within the array of UV lamps 502 directed specifically at the substrate may be selectively powered independently from other bulbs within the array of UV lamps 502 such that select bulbs are turned on for either the clean process or the cure process.

The array of UV lamps 502 can utilize highly efficient bulbs such as UV light emitting diodes. UV sources powered by microwave or pulsed sources have a conversion efficiency of five percent compared to low power bulbs, such as 10 W-100 W, that can be in the array of UV lamps 502 to provide a conversion efficiency of about twenty percent. With the microwave power source ninety five percent of the total energy is converted to heat that wastes energy and necessitates extra cooling requirements while only five percent of the energy is converted to UV emission. The low cooling requirement of the low power bulbs can allow the array of UV lamps 502 to be placed closer to the substrate (e.g., between one and six inches) to reduce reflected UV light and loss of energy.

Furthermore, the bottom surface 500 of the lid assembly can include a plurality of gas outlets 504 interleaved within the array of UV lamps 502. Accordingly, curing and cleaning gases can be introduced into a process region within a chamber from above. Additional detailed information may be obtained from U.S. patent application Ser. No. 11/124908, filed May 9, 2005 which is hereby incorporated by reference herein.

Edge Ring Substrate Support Design

Figure 5:
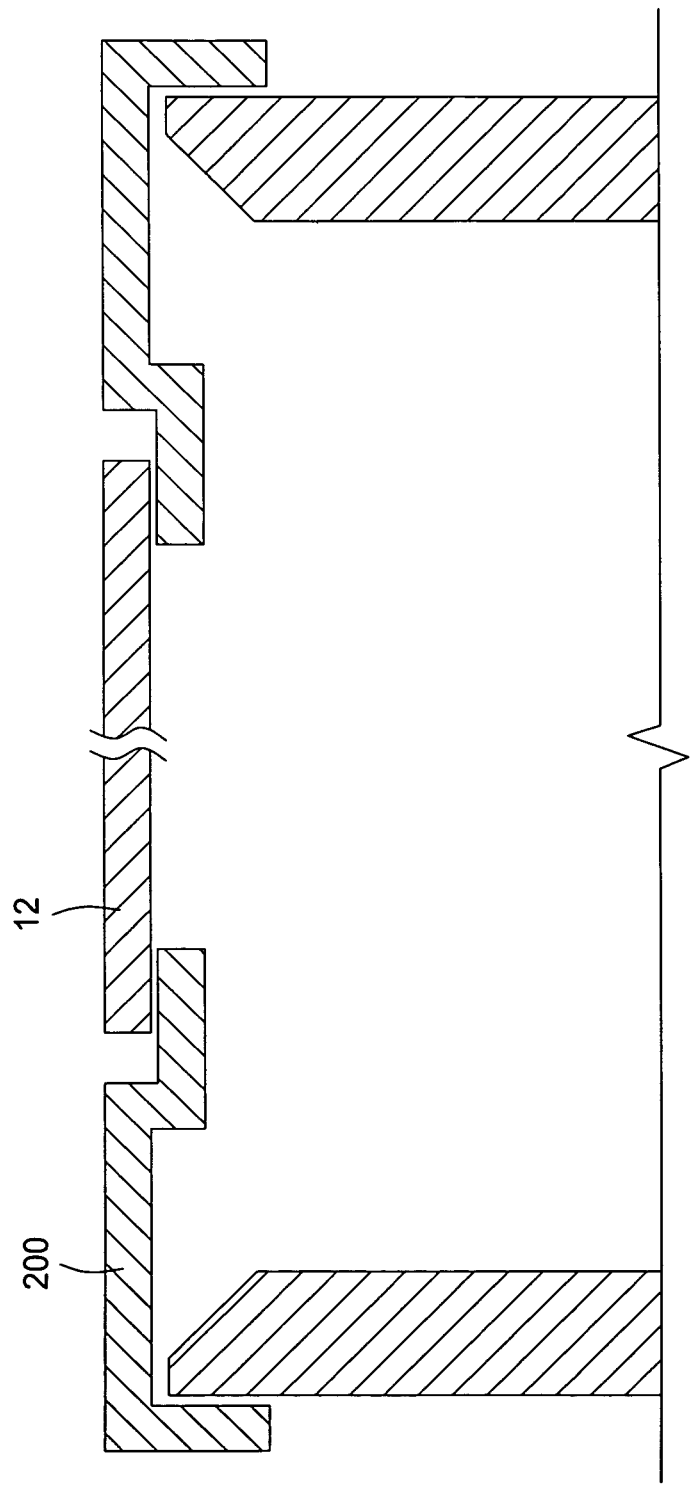
FIG. 5 is a sectional view of an embodiment of an edge ring design.

An additional heat transfer tailoring mechanism is the edge ring substrate support 20. The edge ring substrate support 20 supports the substrate 12 in the RTP chamber. The ratio of substrate thickness to ring thickness is preferably between 1.14 and 1.30 for the embodiment shown in FIG. 5.

The following empirical formula models how thermal mass and emissivity at the edge and at the center of the substrate are related.

$$T_{maer} = \epsilon_{er}/\epsilon_w * t_{maw}/R$$

wherein, $T_{maer}$=thermal mass per area facing lamps for edge ring
$t_{maw}$=thermal mass per area facing lamps for substrate
$\epsilon_{er}$=emissivity of edge ring
$\epsilon_w$=emissivity of substrate, side facing lamps
R=optimum ratio, for example ~1.13 for 200 mm diameter substrate system and ~1.15 for 300 mm diameter substrate system for an edge ring such as the rings illustrated in FIG. 2.

Thermal mass per area is the entire mass of a component times an average heat capacity divided by surface area facing the lamps. Units for thermal mass are $J/K/m^2$. Heat capacity is conveniently averaged over an anneal range of interest, typically 550° C. to 1100° C. From this empirical formula, the optimum design parameters of the ring can be calculated when the properties of the substrate are known.

For example, to design an edge ring for a 300 mm substrate with an emissivity of 0.95 and a thermal mass area facing the lamps of 1715 J/K/m$^2$ with a minimum edge temperature gradient, the edge ring is oxidized silicon carbide with an emissivity of 0.94, and the optimum ratio for a 300 mm substrate system is 1.15, the thermal mass per area facing lamps for an edge ring is 1476 J/K/m$^2$.

1. Alteration of the Edge Ring Substrate Support Thermal Mass

In one embodiment, the temperature profile of a substrate may be altered by using low density edge rings produced from isostatically pressed and sintered silicon carbide, such as produced by the commercially available Bridgestone flame-spray process. For improved thermal stability, the edge ring may be pre-oxidized. Also, varying the thickness of the ring across the radius of the ring leads to non-uniform resistivity that compensates for chamber and substrate variations. For example, thinner parts of the low density edge ring have faster heat transfer. Thus, the edge ring may not require a coating to control resistivity, however; various coatings can be applied to further control resistivity across the edge ring.

2. Alteration of the Edge Ring Absorptivity

The same formula from above illustrates how the heat capacity and radiation profile may influence the choice of coating and material of construction for the edge ring. When the emissivity of the edge ring is altered, the other components of the equation may be effected.

A. Material of Construction

Prior edge rings use CVD grown carbide having a silicon coating that resulted in the edge ring being transparent to the infrared sensors. It is more desirable to use a low density edge ring comprising a pressed, sintered silicon carbide containing nitrogen to avoid a transparency problem that may arise when the ring does not reflect of the chamber's heat. The porous edge ring is obtained by sintering a mixture of a powder of silicon carbide and a nonmetallic auxiliary sintering agent in a flame spray process. The material may provide more uniform heat transfer because the density is more uniform; the nitrogen that escapes the material is less detrimental to the process than the gas that escapes from the carbide, and light transmission is more desirable.

B. Coatings

Coatings may also be used on the edge ring to tailor the temperature gradient in the chamber. Adding nitride or graphite coatings may increase the emissivity. Other coatings such as polysilicon may be used to increase reflection to increase the cooling in the chamber. Varying the thickness of the coating may also influence the reflectivity of the edge ring. Coatings may influence the chamber's heat transfer profile more markedly if the substrate is not rotated.

Pedestal Substrate Support

The pedestal substrate support may be heated to about 400 to about 450° C. and may also provide a source of heat for preheat steps. The pedestal substrate support may provide a variety of motion such as rotational or vertical movement or remain stationary during processing. The substrate may rotate from about 0 rpm to about 300 rpm. The substrate support may provide vertical motion by utilizing magnetic levitation, for example magnetic levitation that utilizes five magnets. Additional magnetic levitation information is available is U.S. Pat. No. 6,800,833, filed Mar. 29, 2002, which is hereby incorporated by reference herein.

Laser Anneal System

Figure 6:
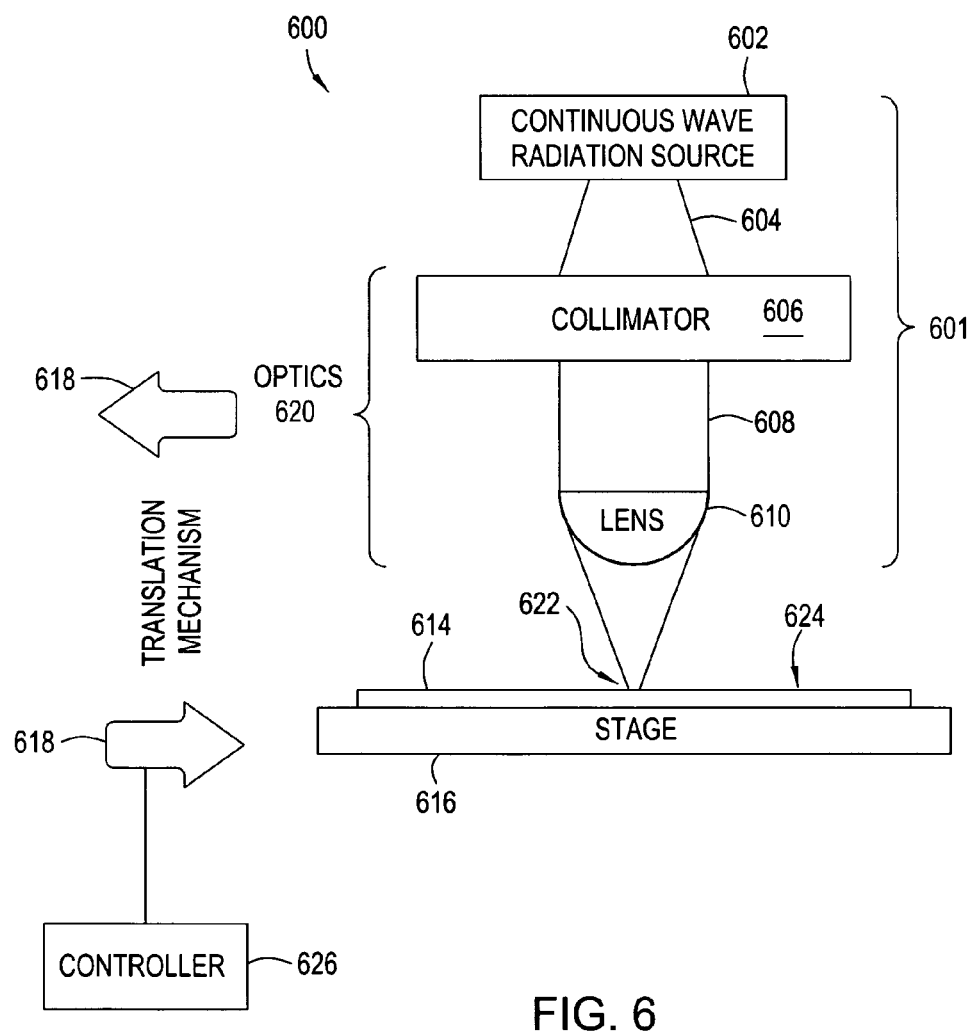
FIG. 6 is a schematic view of an embodiment of a laser anneal system.

A laser may be used in combination with the RTP chamber. FIG. 6 illustrates a laser system that may be used with a rapid thermal anneal system. An example of a laser apparatus 600 that may be used with embodiments described herein is shown in FIG. 6. The apparatus 600 comprises a continuous wave electromagnetic radiation module 601, a stage 616, configured to receive a substrate 614 thereon, and a translation mechanism 618. The continuous wave electromagnetic radiation module 601 comprises a continuous wave electromagnetic radiation source 602 and focusing optics 620 disposed between the continuous wave electromagnetic radiation source 602 and the stage 616.

In a preferred embodiment, the continuous wave electromagnetic radiation source 602 is capable of emitting radiation continuously for at least 15 seconds. Also, in a preferred embodiment, the continuous wave electromagnetic radiation source 602 comprises multiple laser diodes, each of which produces uniform and spatially coherent light at the same wavelength. In yet another preferred embodiment, the power of the laser diode/s is in the range of about 0.5 kW to about 50 kW, but preferably approximately 2kW. Suitable laser diodes are made by Coherent Inc. of Santa Clara, Calif.; Spectra-Physics of California; or by Cutting Edge Optronics, Inc. of St. Charles Mo. A preferred laser diode is made by Cutting Edge Optronics, although another suitable laser diode is Spectra Physics' MONSOON® multi-bar module (MBM), which provides about 40 to about 480 Watts of continuous wave power per laser diode module.

The focusing optics 620 preferably comprise one or more collimators 606 to collimate radiation 604 from the continuous wave electromagnetic radiation source 602 into a substantially parallel beam 608. This collimated radiation 608 is then focused by at least one lens 610 into a line of radiation 622 at an upper surface 624 of the substrate 614. Lens 610 is any suitable lens, or series of lenses, capable of focusing radiation into a line. In a preferred embodiment, lens 610 is a cylindrical lens. Alternatively, lens 610 may be one or more concave lenses, convex lenses, plane mirrors, concave mirrors, convex mirrors, refractive lenses, diffractive lenses, Fresnel lenses, gradient index lenses, or the like.

The stage 616 is any platform or chuck capable of securely holding the substrate 614 during translation, as explained below. In a preferred embodiment, the stage 616 includes a means for grasping the substrate, such as a frictional, gravitational, mechanical, or electrical system. Examples of suitable means for grasping include mechanical clamps, electrostatic or vacuum chucks, or the like.

The apparatus 600 also comprises a translation mechanism 618 configured to translate the stage 616 and the line of radiation 622 relative to one another. In one embodiment, the translation mechanism 618 is coupled to the stage 616 to move the stage 616 relative to the continuous wave electromagnetic radiation source 602 and/or the focusing optics 620. In another embodiment, the translation mechanism 618 is coupled to the continuous wave electromagnetic radiation source 602 and/or the focusing optics 620 to move the continuous wave electromagnetic radiation source 602 and/or the focusing optics 620 relative to the stage 616. In yet another embodiment, the translation mechanism 618 moves both the continuous wave electromagnetic radiation source 602 and/or the focusing optics 620, and the stage 616.

Any suitable translation mechanism may be used, such as a conveyor system, rack and pinion system, or the like. The translation mechanism 618 is preferably coupled to a controller 626 to control the scan speed at which the stage 616 and the line of radiation 622 move relative to one another. In addition, translation of the stage 616 and the line of radiation 622 relative to one another is preferably along a path perpendicular to the line of radiation 622 and parallel to the upper surface 624 of the substrate 614. In a preferred embodiment, the translation mechanism 618 moves at a constant speed. Preferably, this constant speed is approximately 2 cm/s for a 35 micron wide line. In another embodiment, the translation of the stage 616 and the line of radiation 622 relative to one another is not along a path perpendicular to the line of radiation 622.

The laser shown and described with respect to FIG. 6 and other embodiments of lasers that may be used with the embodiments described herein are further described in commonly assigned U.S. patent application Ser. No. 10/126,419, filed Apr. 18, 2002, entitled "Thermal Flux Process by Scanning," which is incorporated by reference herein. Additional information about laser anneal systems is disclosed in U.S. patent application Ser. No. 10/784,904, filed Feb. 23, 2004 which is hereby incorporated by reference herein.

Introduction of Multiple Gas Jets Directed onto the Edge Ring or Wafer

Purge gas jets discharging on the wafer or edge ring may produce localized cooling. The number and location of the jets, the nature of the gas, and the velocity of the gas can be adjusted for the amount and extent of cooling. The velocity and composition of each jet could be programmed individually if desired. Altering the radial gas flows and compositions could create radial gradients of temperature.

Reflector Plate Reflectivity

Control of the wafer temperature profile can be improved by selectively coating the reflective surface 22. The reflective surface 22 may be interchangeable to further tailor heat transfer properties. The coating may be selected because of its reflectivity or other optical property, ability to be modified as a function of time, or other heat transfer properties. The surface may be coated with amorphous carbon, aluminum, aluminum oxide, or other materials. For example, the coating may include a stack of titanium oxide and silicon oxide. Over time, the layers of the coating may be removed as it is exposed to high temperatures. The coating should be removed and replaced as needed to maintain uniform heat transfer properties, such as reflectivity. Also, the ability to dynamically introduce and remove a coating on the reflector plate (e.g. through a gas mixture) to modulate the absorptive property of the reflector plate is another way to tailor the reflective properties of the plate.

Heat, electrical bias, and/or voltage may be applied to the reflector plate to change the reflective properties of the plate. Changing the surface area of the reflective surface 22 with holes or other shapes cut into the reflector or adding tape or bolts to the surface of the reflector plate can be used to tailor the temperature profile. Furthermore, geometric approaches such as blistering or dimpling the reflector plate can be used alone or in combination with a coating to further improve the wafer temperature profile.

Use of Offset Temperatures to Develop Radial Temperature Gradients Using the Lamp Control System Ordinarily, the UV lamps 16 and reflector 22 are designed to produce a relatively uniform irradiance on the wafer. This irradiance distribution can be arbitrarily adjusted with radial symmetry by deliberately altering the offset temperatures. Placing the lamps off center is desirable for heat distribution and for better convection for wafer cooling. Also, radial locations on the wafer where higher temperatures are desired could have the corresponding lamp locations comprised of higher power lamps, while the adjacent, cooler locations can be comprised of lower power lamps, or in some locations the lamps may be removed. Where increased temperature gradients are required, reflectors producing narrower beams upon reflection could be used to decrease the radiation spread from one control zone to another.

The chamber could also be engineered to radiate additional power through certain lamps or certain zones of lamps. This additional power could be used to tailor the temperature profile on the wafer as desired. If the wafer were rotating with respect to the lamp head, then these engineered temperature profiles would mainly consist of non-uniform temperature profiles along the radius of the wafer. Radial locations where non-uniformity is desired could have the corresponding lamps increase or decrease in power as desired. Altering the lamp parameters could be used to compensate for the difference in edge temperature range effect caused by wafers of different emissivities.

Dynamic Pressure Control

Providing pressure control for different regions of the processing chamber may also be desirable for heat transfer tuning. For example, the upper region may have a lower pressure than the lower region at some times in the process and the upper region may have a higher pressure than the upper region at other times in the process. This pressure control may be tailored to improve the heat transfer of the chamber including heat absorption and reflection. Introducing a high pressure region may be helpful for raising the temperature of the chamber quickly and the low pressure region may be desirable for lowering the chamber temperatures quickly.

Introduction of Different Lamp Reflectors

Reflectors may be conditionally arranged hexagonally to reflect uniformly onto a rotated wafer. Also, the center lamp of the bank of lamps does not have the same reflector pattern behind it as the other lamps because of space limitations.

Diffusive optics are possible with center bulbs that are coated or sandblasted. Other zones may benefit by using diffusive optics to control the direct radiation on the wafer. That is, accentuating the boundary between the substrate and the edge ring might be desirable. Ways to modify the bulb and reflector system may also include modifying the coil or taper angles of the bulb.

Alteration of the Substrate-Reflector Plate Separation

Localized alteration of the wafer-reflector plate separation is helpful for adjusting the conductive cooling mechanism. By altering the wafer-reflector plate separation, the blackbody effectiveness may be improved. Improving the blackbody effectiveness may also improve temperature measurement. Adjusting the view angle, the angle the gas enters through the reflector plate, can also improve cooling.

Alteration of the Thermal Conductivity of the Medium Between the Substrate and Reflector Plate Altering the thermal conductivity of the medium between the wafer and the reflector plate can also help tailor the temperature profile in the chamber. The location of the gas outlets in the region can be varied. The flow rate of the gas can be varied. Also, the conductivity of the gas can be improved by selecting gases based on their conductivity and molecular weight. Additionally, the concentration of different gases can also be used to improve cooling control. For example, 100% Xe; 50% Xe and 50% He; and 100% He outlets in different parts of the reflective surface might be desirable. Finally, the exit and entrance ports might also be modified for uneven gas distribution.

Placement of Protrusions on the Edge Ring to Enhance Turbulence

Placing protrusions on the edge ring to enhance turbulence may also help tailor the temperature profile of the chamber.

Providing a combination of approaches to tailor the temperature profile of an RTP chamber can result in improved heat transfer within the chamber and a more uniform temperature profile across the surface of the substrate. Using these approaches can result in a 30 second anneal at 1200 to 1250° C. with less than a 2° C. drop across the radius of the 300 mm substrate.

Additionally, an individual substrate-by-substrate approach may be used to compensate for variation in substrate front side emissivity profiles. That is, the emissivity of the individual device wafers can be used to set the desired temperature variation across the substrate to correct the undesirable variation in the emissivity of individual substrates.

A non-uniform temperature profile could also be useful in developing different devices or product types on a particular wafer. Processor speeds and other characteristics on the resultant devices depend on temperature and the duration of the high temperature exposure that that particular device observes during a spike anneal. By engineering the temperature profile, different areas on the wafer could yield different devices with different processor speeds.

The wafer edge temperature range was varied as a function of the ratio of edge ring heat transfer rate and wafer heat transfer rate for a 300 mm wafer and the results were plotted. Wafer edge temperature range is the temperature difference between a point near the wafer edge and the nearest temperature measurement across the diameter of the wafer. Two correlation lines were drawn to estimate the correlation and accuracy of the data. The equation for the similar radial distribution has a lower correlation factor than the equation for the different flat thickness distribution. That is, the model for the different flat thicknesses distribution is more accurate than the similar radial distribution model. Thus, altering the edge ring thermal mass may change the ratio of heat transfer rates.

Testing to determine how the wafer edge temperature varies as a function of the ratio of an edge ring heat transfer rate and a wafer heat transfer rate for a 200 mm wafer was performed. As the edge ring heating rate was increased compared to the wafer heat transfer rate, the wafer edge temperature range increased linearly with a correlation of greater than 95 percent. This indicates that the heat transfer process can be tailored by selecting the edge ring heat transfer properties.

While the foregoing is directed to embodiments of the present invention, other and further embodiments of the invention may be devised without departing from the basic scope thereof, and the scope thereof is determined by the claims that follow.

The invention claimed is:

1. A chamber for rapid thermal annealing, comprising:
a first heat source affixed to a lid of the chamber, wherein the first heat source is a plurality of UV lamps;
a second heat source fixed on the lid or disposed within the chamber, wherein the first and second heat sources are independently controllable, and wherein the second heat source is a UV lamp having a different wavelength than the plurality of UV lamps;
a substrate support positioned within a base of the chamber; and
a gas distribution assembly in communication with the chamber.

2. A chamber for rapid thermal annealing, comprising:
a first heat source affixed to a lid of the chamber;
a second heat source fixed on the lid or disposed within the chamber, wherein the first and second heat sources are independently controllable;
a substrate support positioned within a base of the chamber;
a gas distribution assembly in communication with the chamber; and
a reflector plate with an interchangeable surface, wherein the gas distribution assembly provides gas distribution through the reflector plate.

3. A chamber for rapid thermal annealing, comprising:
a first heat source affixed to a lid of the chamber, wherein the first heat source is a plurality of UV lamps, wherein the plurality of lamps further comprises a quartz window, and wherein the plurality of lamps further comprises a gas cooling system;
a second heat source fixed on the lid or disposed within the chamber, wherein the first and second heat sources are independently controllable;
a substrate support positioned within a base of the chamber; and
a gas distribution assembly in communication with the chamber.

* * * * *

UNITED STATES PATENT AND TRADEMARK OFFICE
CERTIFICATE OF CORRECTION

PATENT NO. : 8,536,492 B2
APPLICATION NO. : 11/187188
DATED : September 17, 2013
INVENTOR(S) : Ramamurthy et al.

It is certified that error appears in the above-identified patent and that said Letters Patent is hereby corrected as shown below:

In the Specification

Column 3, Line 39, please delete "Increase" and insert --increase--, therefor;

Column 4, Line 26, please delete "Illumination" and insert --illumination--, therefor.

Signed and Sealed this
Nineteenth Day of November, 2013

Teresa Stanek Rea
*Deputy Director of the United States Patent and Trademark Office*